(12) United States Patent
Dutta et al.

US007559215B2

(10) Patent No.: US 7,559,215 B2
(45) Date of Patent: *Jul. 14, 2009

(54) METHODS OF DRAWING HIGH DENSITY NANOWIRE ARRAYS IN A GLASSY MATRIX

(75) Inventors: Biprodas Dutta, Silver Spring, MD (US); Ian L. Pegg, Alexandria, VA (US); Robert K. Mohr, Washington, DC (US); Jugdersuren Battogtokh, Arlington, VA (US)

(73) Assignee: ZT3 Technologies, Inc., Thousand Oaks, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 11/299,283

(22) Filed: Dec. 9, 2005

(65) Prior Publication Data

US 2007/0131266 A1    Jun. 14, 2007

(51) Int. Cl.
*C03C 14/00* (2006.01)
*C03B 37/02* (2006.01)
*H01L 35/16* (2006.01)
*H01L 35/14* (2006.01)

(52) U.S. Cl. ............... 65/442; 65/444; 65/475; 65/477; 136/238; 136/239

(58) Field of Classification Search ............ 65/36, 65/475–477, 442, 444, 435; 136/228, 232, 136/238–240
See application file for complete search history.

(56) References Cited

U.S. PATENT DOCUMENTS 3,040,113 A    6/1962   Lindenblad (Continued)

FOREIGN PATENT DOCUMENTS

JP    61-232242 A    10/1986

(Continued)

OTHER PUBLICATIONS

Jacob et al. (Proceeding of SPIE—vol. 5734, Quantum dots, nanoparticles, and nanoclusters II, D.L. Huffaker, P.K. Bhattachara, eds., Apr. 2005, pp. 124-129.*

(Continued)

*Primary Examiner*—Steven P. Griffin
*Assistant Examiner*—Jason L. Lazorcik
(74) *Attorney, Agent, or Firm*—Foley & Lardner LLP

(57) ABSTRACT

The present invention provides a method of drawing a thermoelectrically active material in a glass cladding, comprising sealing off one end of a glass tube such that the tube has an open end and a closed end, introducing the thermoelectrically active material inside the glass tube and evacuating the tube by attaching the open end to a vacuum pump, heating a portion of the glass tube such that the glass partially melts and collapses under the vacuum such that the partially melted glass tube provides an ampoule containing the thermoelectric material to be used in a first drawing operation, introducing the ampoule containing the thermoelectric material into a heating device, increasing the temperature within the heating device such that the glass tube melts just enough for it to be drawn and drawing fibers of glass clad thermoelectrically active material. The invention further provides a method for bunching together such fibers and re-drawing them one or more times to produce arrays of thermoelectric nanowires clad in glass.

24 Claims, 5 Drawing Sheets

U.S. PATENT DOCUMENTS

| | | | |
|---|---|---|---|
| 3,064,063 A | 11/1962 | Imelmann | |
| 3,256,584 A | 6/1966 | Parkhachev | |
| 3,262,251 A | 7/1966 | Hicks | |
| 3,294,504 A | 12/1966 | Hicks | |
| 3,356,539 A | 12/1967 | Stachurski | |
| 4,453,961 A | 6/1984 | Berkey | |
| 4,578,097 A | 3/1986 | Berkey | |
| 4,652,288 A * | 3/1987 | Saito | 65/389 |
| 4,839,487 A | 6/1989 | Ito et al. | |
| 4,853,020 A | 8/1989 | Sink | |
| 4,963,195 A | 10/1990 | Kodato et al. | |
| 5,006,671 A | 4/1991 | Boeke | |
| 5,215,565 A | 6/1993 | Urano et al. | |
| 5,491,452 A | 2/1996 | Ohtsubo et al. | |
| 5,550,387 A | 8/1996 | Elsner et al. | |
| 5,644,185 A | 7/1997 | Miller | |
| 5,808,233 A | 9/1998 | Finkel et al. | |
| 5,811,376 A | 9/1998 | Huang | |
| 5,886,292 A | 3/1999 | Nishimoto | |
| 5,900,071 A | 5/1999 | Harman | |
| 6,060,656 A | 5/2000 | Dresselhaus et al. | |
| 6,100,463 A | 8/2000 | Ladd et al. | |
| 6,112,395 A | 9/2000 | Quick et al. | |
| 6,174,352 B1 | 1/2001 | Semerdjian et al. | |
| 6,231,744 B1 | 5/2001 | Ying et al. | |
| 6,300,150 B1 | 10/2001 | Venkatasubramanian | |
| 6,452,206 B1 | 9/2002 | Harman et al. | |
| 6,514,453 B2 | 2/2003 | Vigliotti et al. | |
| 6,584,808 B1 * | 7/2003 | Roba et al. | 65/412 |
| 6,598,405 B2 | 7/2003 | Bell | |
| 6,627,809 B1 | 9/2003 | Koga et al. | |
| 6,670,539 B2 | 12/2003 | Heremans et al. | |
| 6,696,635 B2 | 2/2004 | Prasher | |
| 6,710,238 B1 | 3/2004 | Shingu et al. | |
| 6,772,611 B2 * | 8/2004 | Kliner et al. | 65/377 |
| 6,787,691 B2 | 9/2004 | Fleurial et al. | |
| 6,828,579 B2 | 12/2004 | Ghamaty et al. | |
| 6,858,154 B2 | 2/2005 | Suzuki et al. | |
| 6,873,638 B2 | 3/2005 | Haase et al. | |
| 6,882,786 B1 * | 4/2005 | Kliner et al. | 385/115 |
| 6,898,357 B2 * | 5/2005 | Han et al. | 385/122 |
| 6,969,679 B2 | 11/2005 | Okamura et al. | |
| 6,996,147 B2 | 2/2006 | Majumdar et al. | |
| 7,172,661 B1 | 2/2007 | Adar et al. | |
| 2002/0176815 A1 | 11/2002 | Fleurial et al. | |
| 2003/0047204 A1 | 3/2003 | Fleurial et al. | |
| 2003/0110892 A1 | 6/2003 | Nicolaou | |
| 2003/0121540 A1 | 7/2003 | Onoue | |
| 2003/0135971 A1 | 7/2003 | Liberman et al. | |
| 2004/0107988 A1 | 6/2004 | Harman et al. | |
| 2004/0112418 A1 | 6/2004 | Yang et al. | |
| 2004/0238022 A1 | 12/2004 | Hiller et al. | |
| 2004/0238802 A1 | 12/2004 | Hiller et al. | |
| 2004/0261829 A1 | 12/2004 | Bell | |
| 2005/0051208 A1 | 3/2005 | Mount | |
| 2005/0060884 A1 | 3/2005 | Okamura et al. | |
| 2005/0105047 A1 | 5/2005 | Smitth, III et al. | |
| 2005/0150539 A1 | 7/2005 | Ghoshal et al. | |
| 2005/0161662 A1 | 7/2005 | Majumdar et al. | |
| 2005/0252248 A1 | 11/2005 | Kornreich et al. | |
| 2006/0032526 A1 | 2/2006 | Fukutani et al. | |
| 2006/0048809 A1 | 3/2006 | Onvural | |
| 2006/0068080 A1 | 3/2006 | Yadav et al. | |
| 2006/0118158 A1 | 6/2006 | Zhang et al. | |
| 2006/0130995 A1 | 6/2006 | Adar et al. | |
| 2007/0131269 A1 | 6/2007 | Dutta | |
| 2007/0245774 A1 | 10/2007 | Dutta | |

FOREIGN PATENT DOCUMENTS

| | | |
|---|---|---|
| JP | 2004-193200 A | 7/2004 |
| JP | 2004 198200 | 8/2004 |
| SU | 383094 | 8/1973 |
| WO | WO 9800371 A1 * | 1/1998 |
| WO | WO 00/30185 | 5/2000 |

OTHER PUBLICATIONS

Cho, J.S., Paek, U-C., and Han, W-T., "Fabrication and heat treatment effects on absorption characteristics of glass fibers doped with PbTe semiconductor quantum dots" Optical Fiber Communication Conference and Exhibit, 2001. OFC 2001 vol. 4, 2001 pp. ThC4-1-ThC4-3 vol.4.*

Hicks, L.D. et al., The Effect of Quantum Well Structures on the Thermoelectric Figure of Merit, 1993, pp. 821-826, vol. 281, Materials Research Society, Boston, MA, USA.

Wagner, Andrew V. et al., Multilayer Thermoelectric Films: A Strategy for the Enhancement of ZT, 1995, pp. 87-92, vol. 3, The American Society of Mechanical Engineers, Orlando, FL, USA.

Sun, X. et al., Theoretical Modeling of the Thermoelectric Figure of Merit in Si/Si 1-xGe x Quantum Well Structures, 1998, pp. 47-50, IEEE, Nagoya, Japan.

Rogacheva, E.I. et al., Quantum Size Effects in IV-VI Quantum Wells, 2003, pp. 313-315, vol. 17, Toulouse, France.

Rogacheva, E. I. et al., Effect of Electron Concentration on the Tghickness Dependences of the Thermoelectric Properties of PbTe Quantum Wells, 2002, pp. 280-283, IEEE, Long Beach, CA, USA.

Logvinov, Georgiy et al., Upper Value of Thermoelectric Figure of Merit for Isotropic Semiconductors, 2003, pp. 452-455, IEEE, La Grande-Motte, France.

Sur et al., "Thermoelectric Properties of p-type PbTe/PbEuTe Quantum Well Structures," $22^{nd}$ International Conference on Thermoelectronics, (2003), IEEE, pp. 403-406.

Ghamaty et al., "Quantum Well Thermoelectric Devices and Applications," $22^{nd}$ International Conference on Thermoelectrics, (2003), IEEE, pp. 563-566.

ZT3 Brochure, "ZT3—Comparison for Quantum Well Materials (sandwich)," Figures 1-3.

Badinter, E. et al., Cast Nanowires and Nanowire-based Filamentary Nanostructures, Proceedings from 2003 Conference on Electron Devices and Solid-State Circuits, Dec. 16-18, 2003, p. 38.

U.S. Appl. No. 11/837,364, filed Aug. 10, 2007, Dutta.

Campo et al., "Frequency-dependent electrical mixing law behavior in spherical particle composites," Journal of Electroceramics, 2002, 9:49-56.

Donald, I.W., "Production, properties and applications of microwire and related products," Journal of Materials Science, 1987, 22:2661-2679.

Grunlan et al., "Lowering the Percolation Threshold of Conductive Composites Using Particulate Polymer Microstructure," Journal of Applied Polymer Science, 2001, 80(4):692-705.

Kantser et al., "Electric Field Effect on Thermopower in Cylindrical Microwires," IEEE $22^{nd}$ International Conference on Thermoelectrics, 2003, 350-354.

Karg et al., "Novel Rapid-Thermal-Processing for CIS Thin-Film Solar Cells," Photovoltaic Specialists Conference, 1993, Conference Record of the $23^{rd}$ IEEE, May 1993, pp. 441-446.

Kempa et al., "Dielectric media based on isolated metallic nanostructures," J. Appl. Physics, 2005, 98:034310, 4 pages.

Leporda et al., "Long Glass-Coated Semimetallic and Semiconducting Wires Prepared by Two Different Liquid Phase Methods," Moldavian Journal of the Physical Sciences, 2002, 1(3):74-81.

Meglei et al., "Glass-coated melt spinning fabrication technology and some physical properties of $Bi_2Te_3$ microwires," Moldavian Journal of the Physical Sciences, 2003, 2(2):277-289.

Petrovic et al., "Synthesis of silicon microwire," J. Mater. Res., Oct. 2001, 16(10):2777-2779.

Rogacheva et al., "Effect of non-stoichiometry on oxidation processes in n-type PbTe thin films," Thin Solid Films, 2003, 423(257-261).

Notice of Allowance mailed Apr. 6, 2009, in copending related U.S. Appl. No. 11/777,112, 11 pages.

* cited by examiner

X-ray diffraction pattern of a glass clad PbTe nano-array

1mm

1mm

DC resistance of a PbTe button (5.2 mm thick) prepared from the first-draw fibers at 300K DC resistance of a glass-clad PbTe button (2.78mm thick) prepared from fibers following second-draw at 300 K.

DC resistance of a PbTe button (2.09 mm) prepared from third-draw fibers at 300 K.

METHODS OF DRAWING HIGH DENSITY NANOWIRE ARRAYS IN A GLASSY MATRIX

FIELD OF THE INVENTION

The present invention is directed to methods for producing thermoelectric devices and more particularly to methods of drawing high density nanowire arrays in a glassy matrix.

BACKGROUND OF THE INVENTION

Thermoelectric materials generate electricity when subjected to a thermal gradient and produce a thermal gradient when electric current is passed through them. Scientists have been trying to harness practical thermoelectricity for decades because practical thermoelectricity could, inter alia: (1) replace fluorocarbons used in existing cooling systems such as refrigerators and air conditioners; and (2) reduce harmful emissions during thermal power generation by converting some or most of the waste heat into electricity. However, the promise of practical thermoelectricity has not yet been fulfilled. One problem is that, because of its low efficiency, the industry standard in thermoelectric technology cannot be functionally integrated into everyday heating and cooling products and systems.

Bulk form thermoelectric devices such as thermoelectric generators (TEG), thermoelectric refrigerators (TER) and thermoelectric heat pumps are used for the direct conversion of heat into electricity, or for the direct conversion of electricity into heat. However, the efficiency of energy conversion and/or coefficient of performance of these bulk form thermoelectric devices are considerably lower than those of conventional reciprocating or rotary heat engines and vapor-compression systems. In view of these drawbacks and the general immaturity of the technology, bulk form thermoelectric devices have not attained immense popularity.

Early thermoelectric junctions were fashioned from two different metals or alloys capable of producing a small current when subjected to a thermal gradient. A differential voltage is created as heat is carried across the junction, thereby converting a portion of the heat into electricity. Several junctions can be connected in series to provide greater voltages, connected in parallel to provide increased current, or both. Modern thermoelectric generators can include numerous junctions in series, resulting in higher voltages. Such thermoelectric generators can be manufactured in modular form to provide for parallel connectivity to increase the amount of generated current.

In 1821, Thomas Johann Seebeck discovered the first thermoelectric effect, referred to as the Seebeck effect. Seebeck discovered that a compass needle is deflected when placed near a closed loop made of two dissimilar metals, when one of the two junctions is kept at a higher temperature than the other. This established that a voltage difference is generated when there is a temperature difference between the two junctions, wherein the voltage difference is dependent on the nature of the metals involved. The voltage (or EMF) generated per ° C. thermal gradient is known as Seebeck coefficient.

In 1833, Peltier discovered the second thermoelectric effect, known as the Peltier effect. Peltier found that temperature changes occur at a junction of dissimilar metals, whenever an electrical current is caused to flow through the junction. Heat is either absorbed or released at a junction depending on the direction of the current flow.

Sir William Thomson, later known as Lord Kelvin, discovered a third thermoelectric effect called the Thomson effect, which relates to the heating or cooling of a single homogeneous current-carrying conductor subjected to a temperature gradient. Lord Kelvin also established four equations (the Kelvin relations) correlating the Seebeck, Peltier and Thomson coefficients. In 1911, Altenkirch suggested using the principles of thermoelectricity for the direct conversion of heat into electricity, or vice versa. He created a theory of thermoelectricity for power generation and cooling, wherein the Seebeck coefficient (thermo-power) was required to be as high as possible for best performance. The theory also required that the electrical conductivity to be as high as possible, coupled with a minimal thermal conductivity.

Altenkirch established a criterion to determine the thermopower conversion efficiency of a material, which he named the power factor (PF). The latter is represented by the equation: $PF=S^2 \ast \sigma = S^2/\rho$, where S is the Seebeck coefficient or thermo-power, $\sigma$ is the electrical conductivity and $\rho(1/\sigma)$ is the electrical resistivity. Altenkirch was thereby led to establish the equation: $Z=S^2 \ast \sigma/k = S^2/\rho \ast k = PF/k$, wherein Z is the thermoelectric figure of merit having the dimensions of $K^{-1}$. The equation can be rendered dimensionless by multiplying it by the absolute temperature, T, at which the measurements for S, $\rho$ and k are conducted such that the dimensionless thermoelectric figure of merit or ZT factor equals $(S^2 \ast \sigma/k)T$. It follows that to improve the performance of a thermoelectric device the power factor should be increased as much as possible, whereas k (thermal conductivity) should be decreased as much as possible.

The ZT factor of a material indicates its thermopower conversion efficiency. Forty years ago, the best ZT factor in existence was about 0.6. After four decades of research, commercially available systems are still limited to ZT values that barely approach 1. It is widely recognized that a ZT factor greater than 1 would open the door for thermoelectric power generation to begin supplanting existing power-generating technologies, traditional home refrigerators, air conditioners, and more. Indeed, a practical thermoelectric technology with a ZT factor of even 2.0 or more will likely lead to the production of the next generation of heating and cooling systems. In view of the above, there exists a need for a method for producing practical thermoelectric technology that achieves an increased ZT factor of around 2.0 or more.

Solid-state thermoelectric coolers and thermoelectric generators in nano-structures have recently been shown to be capable of enhanced thermoelectric performance over that of corresponding thermoelectric devices in bulk form. It has been demonstrated that when certain thermoelectrically active materials (such as PbTe, $Bi_2Te_3$ and SiGe) are reduced in size to the nanometer scale (typically about 4-100 nm), the ZT factor increases dramatically. This increase in ZT has raised expectations of utilizing quantum confinement for developing practical thermoelectric generators and coolers [refrigerators]. A variety of promising approaches such as transport and confinement in nanowires and quantum dots, reduction of thermal conductivity in the direction perpendicular to superlattice planes, and optimization of ternary or quaternary chalcogenides and skutterudites have been investigated recently. However, these approaches are cost-prohibitive and many of the materials cannot be manufactured in significant amounts.

The ability to efficiently convert energy between different forms is one of the most recognizable symbols of advances in science and engineering. Conversion of thermal energy to electrical power is the hallmark of the energy economy, where even marginal improvements in efficiency and conversion methods can have enormous impact on monetary savings, energy reserves, and environmental effects. Similarly, electromechanical energy conversion lies at the heart of many modern machines. In view of the continuing quest for miniaturization of electronic circuitry, nanoscale devices can play a role in energy conversion and also in the development of cooling technology of microelectronic circuitry where a large amount of heat is generated.

Accordingly, there exists a need for a broad spectrum of high performance energy conversion and thermoelectric devices, based on one-dimensional inorganic nanostructures or nanowires.

There also exists a need for one-dimensional inorganic nanostructures that overcome deficiencies inherent in conventional thermoelectric devices.

There further exists a need for a method for generating practical thermoelectric devices from nanostructures that possess significantly larger ZT factors as compared to those of thermoelectrically active materials in bulk form.

In addition, there exists a need for a method for mass-producing practical thermoelectric devices at a ZT factor of around 1.5 and higher.

There further exists a need for a method for producing practical thermoelectric devices that may be cost-effectively integrated into everyday heating and cooling products.

There also exists a need for a method for producing practical thermoelectric devices that provide a smaller footprint than the industry standard.

There further exists a need for a method for producing practical thermoelectric devices capable of being mass-produced at a lower cost than the current industry standard.

In addition, there exists a need for a method for generating electric power from thermoelectric generators to utilize waste heat (e.g., industrial, domestic, automobile, etc.).

SUMMARY OF THE INVENTION

In view of the foregoing, it is an object of the present invention to provide a method for generating practical thermoelectric devices from nanostructures that possess significantly larger ZT factors as compared to those of thermoelectrically active materials in bulk form.

It is an additional object of the present invention to provide a method for mass-producing practical thermoelectric devices at a ZT factor of around 1.5 and higher.

It is another object of the present invention to provide a method for producing practical thermoelectric devices that may be cost-effectively integrated into everyday heating and cooling products.

Additionally, it is an object of the present invention to provide a method for producing practical thermoelectric devices that provide a smaller footprint than the industry standard.

It is a further object of the present invention to provide a method for producing practical thermoelectric devices capable of being mass-produced at a lower cost than the current industry standard.

It is yet another object of the present invention to provide a method for generating electric power from thermoelectric generators to utilize waste heat (e.g., industrial, domestic, automobile, etc.).

The present invention pertains to nanostructures formed from fibers of thermoelectrically active materials that are substantially one-dimensional, having a diameter that is significantly smaller than their length. The fibers from which these nanostructures are composed have a diameter of approximately 200 nm or less. The inventive nanostructures described herein are referred to as, "nanowires", "cables", "arrays", "heterostructures" or "composites" that contain a plurality of one-dimensional fibers. The cables preferably comprise at least one thermoelectrically active material and a glassy material, which acts as an electrical insulator for the thermoelectrically active material, which is also referred to herein as the "thermoelectric material".

According to another aspect of the invention, the thermoelectric material comprises a large concentration (e.g., $10^6$-$10^{10}/cm^2$) of nano-sized wires embedded in a suitable glass forming a cable, wherein the thermoelectric material is in the form of a glass-clad nanowires comprising a plurality of one-dimensional fibers that extend over large distances along the length of the cable without coming in contact with other fibers. The thermoelectrically active material may comprise a suitable metal, alloy or semiconductor material, which maintains the integrity of the interface between the thermoelectric material and the glassy material without any appreciable smearing and/or diffusion of the thermoelectric material.

According to a further aspect of the invention, a process for fabricating cables includes increasing the population of thermoelectric fibers to more than $10^9/cm^2$ of the cross-section of the cable. Each cable includes an array of fibers having a distribution of diameters, wherein the variation in fiber diameter may be reduced by employing automated draw-towers, which are commonly employed in the fiber-optic industry for drawing optical fibers.

A preferred cable produced in accordance with the principles of the present invention preferably comprises at least one thermoelectric fiber embedded in an electrically insulating material, wherein the thermoelectric material exhibits quantum confinement. The preferred cable comprises a plurality of fibers such that there is electrical connectivity between the ends of all the fibers. Alternatively, there is electrical connectivity between some, but not all of, the fibers of the cable. The glass cladding for the cable preferably comprises an electrically insulating material such as pyrex, borosilcate, aluminosilicate, quartz or a glass having lead oxide, tellurium dioxide and silicon dioxide as its main constituents. The thermoelectric material may be chosen from the group consisting of a metal, a semi-metal, an alloy and a semiconductor, such that the thermoelectric material exhibits electrical connectivity and quantum confinement.

The present invention also provides a method of drawing a thermoelectrically active material in a glass cladding, comprising sealing off one end of a glass tube such that the tube has an open end and a closed end, introducing the thermoelectrically active material inside the glass tube and evacuating the tube by attaching the open end to a vacuum pump, heating a portion of the glass tube such that the glass partially melts and collapses under the vacuum such that the partially melted glass tube provides an ampoule containing the thermoelectric material to be used in a first drawing operation, introducing the ampoule containing the thermoelectric material into a heating device, increasing the temperature within the heating device such that the glass tube melts just enough for it to be drawn and drawing fibers of glass clad thermoelectrically active material. The method may further comprise bunching the fibers of glass clad thermoelectrically active material together and redrawing one or more times in succession to produce a multi-core cable having a plurality of individual thermoelectric fibers that are insulated from each other by the glass cladding.

Additionally, the above-described method may further comprise the steps of breaking the glass clad fibers into shorter pieces, introducing the pieces of glass clad fibers into another glass tube having a sealed end and an open end, evacuating the tube by attaching the open end to a vacuum pump, heating a portion of the glass tube such that the glass partially melts and collapses under the vacuum such that the partially melted glass tube provides an ampoule containing the pieces of glass clad fibers, introducing the ampoule into a heating device, increasing the temperature within the heating device such that the glass tube melts just enough for it to be drawn and drawing fibers of glass clad thermoelectrically active material to produce a cable having a plurality of multicore fibers.

Further objects and advantages of the invention will be brought out in the following portions of the specification, wherein the detailed description is for the purpose of fully disclosing preferred embodiments of the invention without placing limitations thereon.

DETAILED DESCRIPTION

Figure 1:
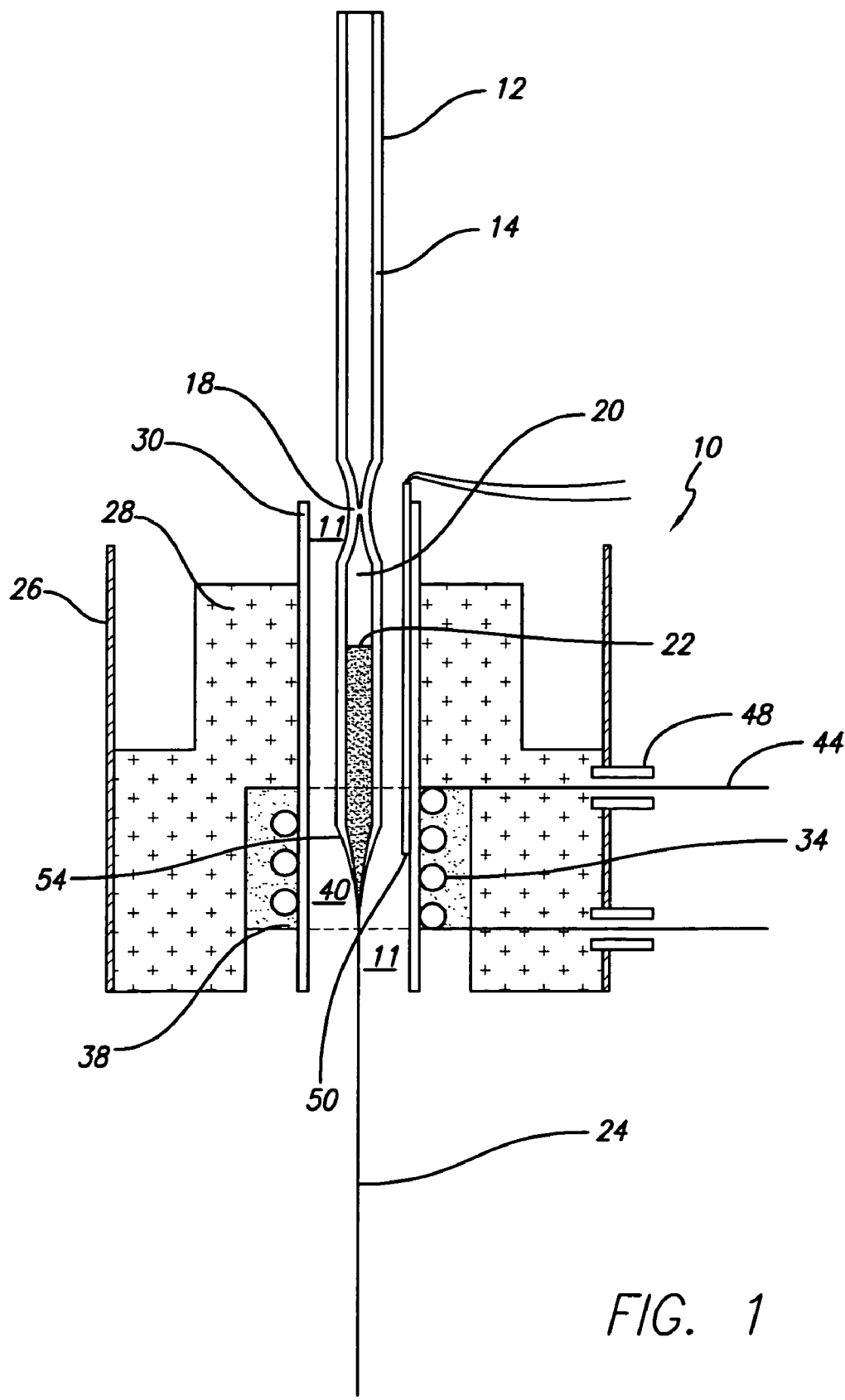
FIG. 1 is a cross-sectional view of a tubular furnace for drawing a thermoelectrically active material embedded in a glass cladding, in accordance with the principles of the present invention.

In the following paragraphs, the present invention will be described in detail by way of example with reference to the attached drawings. Throughout this description, the preferred embodiment and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Before starting a description of the Figures, some terms will now be defined.

Bulk Material: Macroscopic-sized thermoelectric materials that are typically larger than 1 micron or 1 micrometer in all three dimensions.

Chalcogenides: Group VI elements of the periodic table.

Chemical Vapor Deposition: Deposition of thin films (usually dielectrics/insulators) on wafer substrates by placing the wafers in a mixture of gases, which react at the surface of the wafers. This can be done at medium to high temperature in a furnace, or in a reactor in which the wafers are heated but the walls of the reactor are not. Plasma enhanced chemical vapor deposition avoids the need for a high temperature by exciting the reactant gases into a plasma.

Doping: Deliberately adding a very small amount of foreign substance to an otherwise very pure semiconductor crystal. These added impurities give the semiconductor an excess of conducting electrons or an excess of conducting holes (the absence of conducting electrons).

Efficiency: Efficiency is the power generated by a system divided by the power fed into it, a measure of how well a material converts one form of energy into another. Efficiency stands at a mere 8 to 12% for bulk form thermoelectric devices that are currently available or on the near horizon.

Figure of Merit: The thermoelectric figure of merit, ZT, is given by $ZT=(S^2*\sigma/k)*T$, where S is the Seebeck coefficient, T is the absolute temperature, a is the electrical resistivity, and k is the thermal conductivity.

Lead Telluride: PbTe is one of the most commonly used thermoelectric material other than $Bi_2Te_3$. PbTe is typically used for power generation because this material exhibits its highest ZT at temperatures between 400 and 500° C. and has an effective operating range of about 200° C. around 500° C.

Nano: A prefix meaning one-billionth, or 0.000000001. For example, the wavelength of the ultraviolet light used to etch silicon chips is a few hundred nanometers. The symbol for nanometer is nm.

Quantum Confinement: Quantum Confinement takes place when carriers of electricity (electrons or holes) are confined in space by reducing the size of the conductor. For example, a very thin conducting film reduces the freedom of a carrier by limiting its freedom to propagate in a direction perpendicular to the plane of the film. The film is said to be a 2-d structure and the carrier in such a film is said to be quantum confined in one direction. Carrier transport can take place in the two directions available in the plane of the film. In a nanowire, quantum confinement can occur in two directions and the only direction available for carrier transport is along the length of the wire.

Seebeck Coefficient: The electromotive force generated in a material when it is subjected to a thermal gradient and is normally expressed as microvolts per degree Kelvin. The thermoelectric power, or Seebeck coefficient, of a material has a large role in determining its ZT factor.

Thermal Conductivity: Thermal conductivity is an inherent property of a material that specifies the amount of heat transferred through a material of unit cross-section and unit thickness for unit temperature gradient. Though thermal conductivity is an intrinsic property of a medium, it depends on the measurement temperature. The thermal conductivity of air is about 50% greater than that of water vapor, whereas the thermal conductivity of liquid water is about 25 times that of air. Thermal conductivities of solids, especially metals, are thousands of times greater than that of air.

The present invention is directed to nanostructures referred to herein as "nanowires", "cables", "arrays", "heterostructures" or "composites" that contain a plurality of one-dimensional fibers. Nanowires in accordance with the present invention generally comprise heterostructures of at least one thermoelectrically active material and one other compositionally and structurally different material (e.g., glass), wherein an interface or junction is formed therebetween. The thermoelectrically active material is reduced in thickness or diameter to nano-dimensions in order to harness the advantages of quantum confinement. In this manner, the thermoelectric efficiency of the thermoelectrically active material is enhanced. The thermoelectrically active material is also referred to herein as the "thermoelectric material". The cladding material preferably comprises a suitable glass such as a glass comprising an amorphous material having no long range ordering of its constituent atoms.

One aspect of the invention involves a method for producing practical thermoelectricity by developing quantum-confined nanowires capable of exhibiting high ZT values. As explained hereinabove, the equation for the thermoelectric figure of merit, Z, can be rendered dimensionless by multiplying it by an absolute temperature, T, such as the temperature of the hot junction of the thermoelectric device. It follows that the dimensionless thermoelectric figure of merit, $ZT=(S^2*\sigma/k)*T$, can be used in the evaluation of the performance and energy conversion efficiency, of any thermoelectric material or device.

For nanowires of PbTe, if the bulk thermal conductivity (k) of PbTe is considered, the ZT factor at 750 K is still very high (i.e., ZT of around 2.0 or more) using $ZT=(S^2*\sigma/k)*T$. ZT factors increase with temperatures between about 300 K and 750 K. For PbTe-based thermoelectric nanowires, the value of $S^2*\sigma$ tends to peak at a certain level with the ZT factors increasing with decreasing nanowire width. However, after a certain nanowire width is reached, ZT factors begin to fall with decreasing nanowire width. The PbTe-based nanowires described herein may be easily tailored to exhibit n-type or p-type conduction, either by changing the stoichiometry of Pb and Te or by adding some minor components/impurities.

Numerous thermoelectric materials, including PbTe, are sensitive to oxygen, which can degrade thermoelectric performance. For this reason, it is advantageous to have such thermoelectric materials sealed off and protected from oxygen contamination within the target environment range. Of course, a thermoelectric device is not commercially viable if it cannot withstand the elements and environment it is intended to function under.

Although PbTe is the preferred thermoelectric material, other thermoelectric materials may be employed, such as $Bi_2Te_3$, SiGe, ZnSb, $Zn_22$ and $Cd0_{0.8}Sb_3$, without departing from the scope of the present invention. The thermoelectric material may initially be in any convenient form, such as granules or powder.

Once fiber-drawn nanowire cables were produced using the methods described above, the electrical conductivity ($\sigma$) and thermoelectric power (S) were measured and the variation of the parameter, $S^2*\sigma$, was determined. The parameter, $S^2*\sigma$, is determined experimentally, multiplied by the measurement temperature (in K) and divided by the known thermal conductivity (k) to provide the ZT values of the nanowires produced by the present invention.

Testing of the glass cladding without embedded nanowires using the Van der Pauw 4-probe instrument showed that the sample was very resistive such that the instrument did not measure any conductivity. Similarly, the measurement of thermopower using a conventional method (e.g. by employing the Seebeck coefficient determination system, marketed by MMR Technologies, Mountain View, Calif.) did not produce any result on account of the high resistivity of the glass cladding. However, the electrical conductivity and thermoelectric power of PbTe-embedded cables was readily measurable, indicating that the measured values of electrical conductivity and thermoelectric power are attributable to the continuous nanowires along the length of the cable.

The preferred thermoelectric material for the nanowire cables of the present invention is PbTe because of its advantageous thermoelectric properties and reasonable cost. Using the known bulk thermal conductivity value for PbTe, the calculated ZT $((S^2\sigma/k)*T)$ factor at 750 K is >2.5. The $S^2\sigma$ of PbTe exhibits a definite tendency to peak at a certain nanowire width. Given that the best known ZT factors for bulk PbTe is around 0.5, the resultant ZT factors of around 2.0 or more is considered to be significantly enhanced by quantum confinement. The ZT factor increases with decreasing nanowire width until this maximum value is reached, and then the ZT factor begins to decrease with further decrease in nanowire width. As would be appreciated by those of skill in the art, other thermoelectric materials having suitable thermoelectric properties (e.g., $Bi_2Te_3$) may be employed without departing from the scope of the invention.

In accordance with the present invention, a maximum diameter of the nanowires is preferably less than approximately 200 nm, most preferably between approximately 5 nm and approximately 100 nm. In cases where the cross-section of the nanowires is not circular, the term "diameter" in this context refers to the average of the lengths of the major and minor axis of the cross-section of the nanowires, with the plane being normal to the longitudinal axis of the nanowires. Nanowires having diameters of approximately 50 nm to approximately 100 nm that may be prepared using a method of drawing of a thermoelectric material in glass cladding, as described hereinbelow.

The cables of the present invention preferably are manufactured to exhibit a high uniformity in diameter from end to end. According to some embodiments of the invention, the maximum diameter of the glass cladding may vary in a range of less than approximately 10% over the length of the cable. For less precise applications, the diameter of the nanowires may vary in a larger range (e.g., 5-500 nm, depending on the application). Electrically, the glass is preferably several orders of magnitude more resistive than the thermoelectric material it is employed to clad. The cables are generally based on a semiconducting wire, wherein the doping and composition of the wire is primarily controlled by changing the composition of the thermoelectric material to yield a wire that exhibits either p-type or an n-type thermoelectric behavior. Advantageously, the cables may be used to develop superior thermoelectric devices in a cost-effective manner.

According to the invention, a method of drawing a thermoelectric material in glass cladding involves drawing the glass-clad thermoelectric material to form individual fibers (or monofibers) of thermoelectric materials, which are preferably about 500 microns in diameter or less. As would be appreciated by those of ordinary skill in the art, the monofibers may have diameters greater than 500 microns without departing from the scope of the invention. Cable diameters may be brought down to 5-100 nm by repeatedly drawing fiber bundles of monofibers, and the concentration of wires in a cross-section of the cable may be increased to $\sim10^9/cm^2$ or greater. Such cables advantageously exhibit quantum confinement for providing enhanced thermopower generation efficiency.

The method of drawing a thermoelectric material in glass cladding may further comprise bunching the cable together and redrawing several times in succession to produce a multi-core cable comprising glass-clad thermoelectric fibers. By way of example, the material to forming the fibers of a cable may comprise PbTe or $Bi_2Te_3$. The resulting cable comprises a multi-core cable having a plurality of individual fibers that are insulated from each other by the glass cladding. A particular glass cladding may be chosen to contain a specific composition to match the physical, chemical, thermal and mechanical properties of a selected thermoelectric material. The glass cladding is preferably several orders of magnitude higher in electrical resistivity than the metal, alloy or semiconductor material that forms the thermoelectric fibers. Suitable commercial glasses for most applications include, but are not limited to, pyrex, vycor and quartz glass.

According to a further aspect of the invention, the metal, alloy or semiconductor material that forms the fibers is varied to render a cable either n-type or p-type, such that individual cables may be used as the n-type and p-type components of a thermoelectric device. The cables may be induced to exhibit quantum confinement by reducing the thickness or the diameter of the fibers to a predetermined range, thereby increasing the efficiency of thermopower generation.

Method of Drawing a Thermoelectric Material in a Glass Cladding:

Referring to FIG. 1, vertical tube furnace 10 is employed to provide heat for drawing glass-clad thermoelectric fibers. In particular, vertical tube furnace 10 includes a central lumen 11 for receiving a preform 12 comprising a glass tube 14 that is sealed at an area of reduced cross-section 18 to form vacuum space 20 that is at least partially filled with thermoelectric material 22. The furnace is used to melt the thermoelectric material 22 and glass tube 14 in preparation for one or more drawing operations for producing glass-clad thermoelectric fibers 24.

With further reference to FIG. 1, vertical tube furnace 10 comprises furnace shroud 26, thermal insulation 28 and muffler tube 30. Suitable materials for muffler tube 30 include conductive metals such as aluminum. Vertical tube furnace 10 further comprises one or more heater coils 34 embedded therein. More precisely, heater coils 34 are disposed between muffler tube 30 and thermal insulation 28, and refractory cement 38 is disposed between heater coils 34 and thermal insulation to direct the heat produced by heater coils 34 inwardly to form a hot zone 40 within muffler tube 30. Heater coils 34 are provided with leads 44 that may be insulated using a ceramic insulator 48. Additionally, a thermocouple probe 50 is provided for measuring the temperature within hot zone 40, which may include a length of approximately one inch.

A method of drawing a thermoelectrically active material 22 comprising an array of metal, alloy or semiconductor rods embedded in a glass cladding will now be described. Initially, a suitable thermoelectric material 22 is selected. The preferred thermoelectric material of the present invention comprises PbTe that is initially in granular form. Additional suitable thermoelectric materials include, but are not limited to, $Bi_2Te_3$, SiGe and ZnSb. The next step involves selecting a suitable material for forming the glass tubing 14. The glass material preferably is selected to have a fiber drawing temperature range that is slightly greater than the melting temperature of the thermoelectric material (e.g., $\geqq 920°$ C. for PbTe). Vertical tubular furnace 10 is then employed to seal off one end of glass tubing 14. Alternatively, a blowtorch or other heating device may be used to seal off the glass tubing 14 and create vacuum space 20.

After sealing off one end of the glass tubing 14, the next steps involve introducing the thermoelectric granules inside the vacuum space 20 and evacuating the tube by attaching the open end of the glass tube to a vacuum pump. While the vacuum pump is on, an intermediate portion of the glass tubing 14 is heated such that the glass partially melts and collapses under the vacuum. The partially melted glass tube provides an ampoule 54 containing the thermoelectric material 22 to be used in a first drawing operation. The next step involves introducing the end of ampoule 54 containing the thermoelectric material 22 into the vertical tube furnace 10. In the illustrated embodiment, the tubular furnace 10 is configured such that the ampoule 54 is introduced vertically, wherein the end of the ampoule 54 containing the thermoelectric granules is disposed within hot zone 40 adjacent to heater coils 34.

Once the ampoule 54 is properly disposed in vertical tube furnace 10, the temperature is increased such that the glass encasing the thermoelectric granules melts just enough for it to be drawn, as is done in a conventional glass draw-tower, which is per se known in the art. As discussed hereinabove, the composition of the glass is preferably chosen such that the fiber drawing temperature range is slightly greater than the melting point of the thermoelectric granules. For example, if PbTe is selected as the thermoelectric material, pyrex glass is a suitable material for drawing the glass with PbTe fibers embedded therein. The physical, mechanical and thermal properties of glass tubing 14 and thermoelectric material 22 will have a bearing on the properties of the resulting cables. Glasses exhibiting a minimal deviation of these properties with respect to those of the thermoelectric material 22 are preferably chosen as the cladding material.

The above-described glass tubing 14 may comprise commercially available pyrex tubing having a 7 mm outside diameter and a 2.75 mm inside diameter, wherein the tube is filled with PbTe granules over a length of about 3.5 inches. Evacuation of glass tubing 14 may be achieved overnight under a vacuum of approximately 30 mtorr. After evacuation, the section of glass tubing 14 containing the thermoelectric material 22 is heated gently with a torch for several minutes to remove some residual gas, and then the glass tubing 14 is sealed under vacuum above the level of thermoelectric material 22.

In operation, vertical tube furnace 10 is used for drawing the glass-clad thermoelectric fibers. Vertical tube furnace 10 includes a short hot zone 40 of about 1 inch, wherein the preform 12 is placed in the vertical tube furnace 10 with the end of the tube slightly below hot zone 40. With the furnace at about 1030° C., the weight from the lower tube end is sufficient to cause glass tubing 14 to extend under its own weight. When the lower end of glass tubing 14 appears at the lower opening of the furnace, it may be grasped with tongs for hand pulling. Preform 10 may be manually advanced periodically to replenish the preform material being used up during the fiber drawing process. Fiber 24 preferably includes a diameter between about 70 microns and about 200 microns. According to additional embodiments of the present invention, the drawing operation may be performed using an automatic draw-tower that results in very little variation in diameter.

According to further embodiments of the invention, short fiber sections may be formed by drawing the heterostructures and then breaking or cutting the heterostructures into shorter pieces. By way of example, these shorter pieces may be machined to be approximately 3 inches in length. The pieces are then bundled inside another pyrex tube, which is sealed at one end using the vertical tube furnace or using a blowtorch, as described hereinabove. When a suitable number of monofibers are packed in the tube, the open end is attached to a vacuum pump and an intermediate section is heated. This heating causes the glass tube to collapse, thereby sealing the tube and forming an ampoule for a second drawing operation, which produces a cable having a plurality of multi-core fibers. After the second drawing operation, the fibers are collected and placed in the bore of yet another sealed tube. When the bore is filled with a suitable number of monofibers, the preform is evacuated and sealed under vacuum. Fiber drawing is then performed on the twice-drawn fibers. This process is repeated as needed to obtain a final thermoelectric material diameter of about 100 nm.

Figure 2:
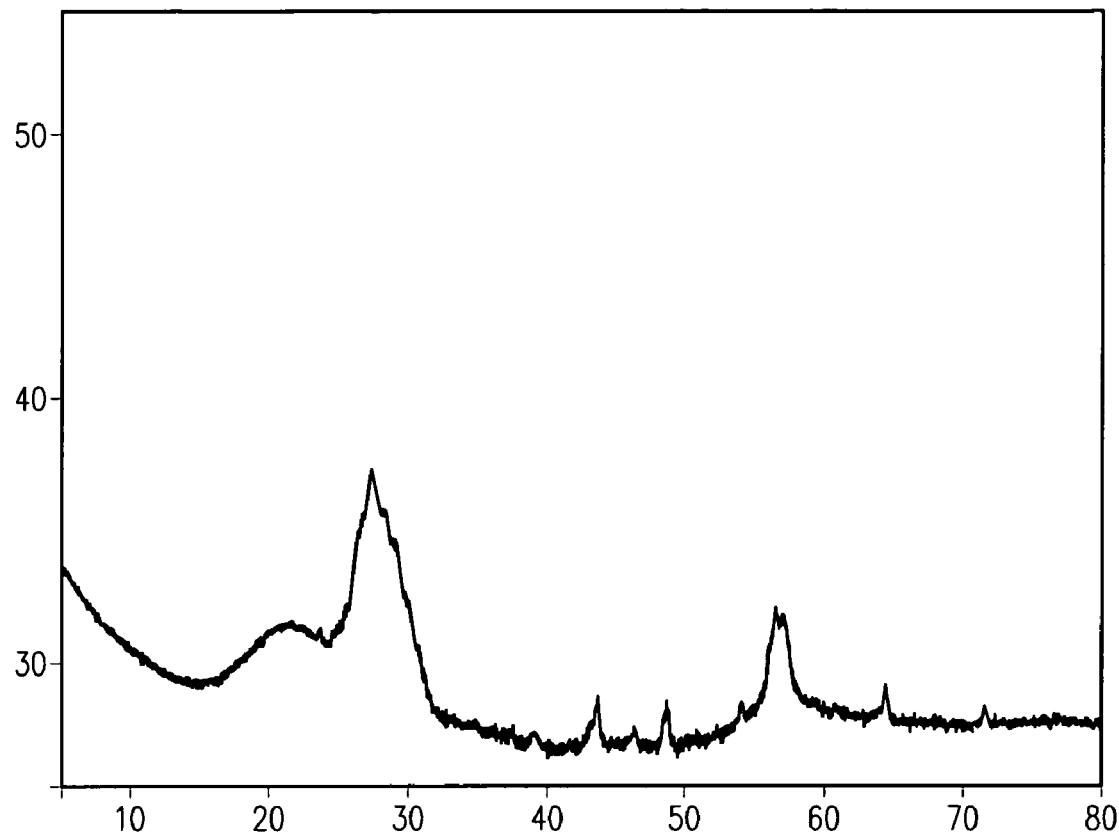
FIG. 2 is an x-ray diffraction pattern of a PbTe-based cable constructed, in accordance with the principles of the invention.

Nanowire Properties:

In order to characterize the electronic properties of bulk and heterostructure nanowires, it is important to determine the x-ray diffraction characteristics of the glass-clad thermoelectric material. FIG. 2 depicts an x-ray diffraction pattern of a PbTe-based cable constructed in accordance with the principles of the present invention, wherein the characteristic spectrum of PbTe is overlaid on a glassy x-ray diffraction pattern. In particular, the x-ray diffraction pattern clearly indicates the presence of PbTe peaks and a lack of other peaks, thus illustrating that the glass material has neither reacted with PbTe nor devitrified during fiber drawing. These peaks are exclusively characteristic to those of PbTe crystals.

Figure 3:
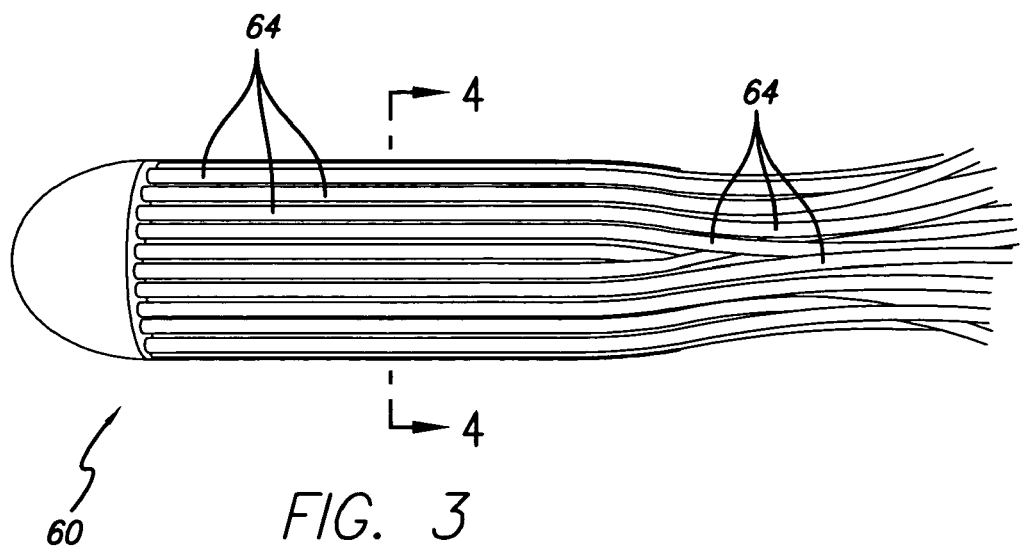
FIG. 3 is a side view of a glass-clad PbTe-based cable constructed in accordance with the principles of the invention.
Figure 4:
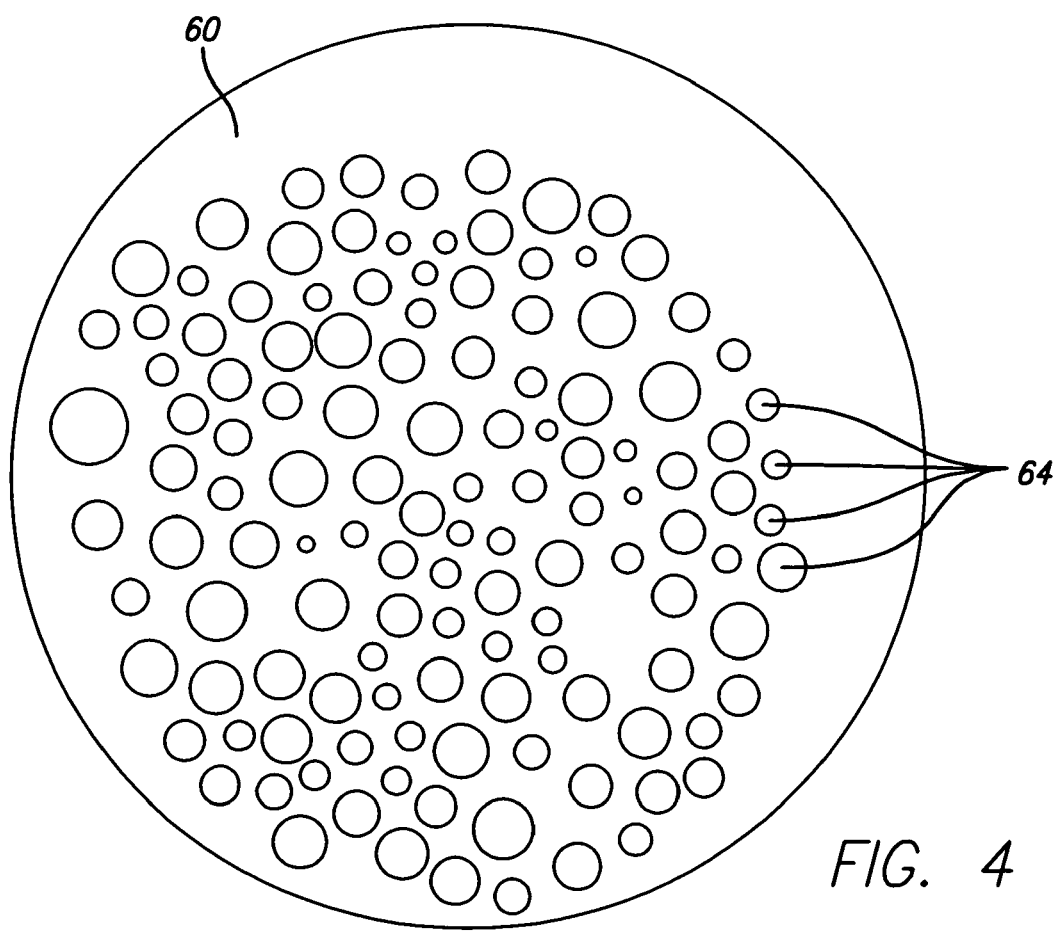
FIG. 4 is an enlarged cross-sectional view of the glass-clad PbTe-based cable of FIG. 3 taken along line 3A-3A.

FIG. 3 depicts a glass-clad PbTe-based cable 60 constructed using the method of drawing a thermoelectrically active material embedded in a glass cladding described hereinabove. Specifically, the cable 60 comprises a plurality of multiple monofibers 64 that are bundled and fused to form a cable (or button) of virtually any length. This button can be broken, cut or otherwise sectioned to produce a plurality of shorter cables having a predetermined length. FIG. 4 is an enlarged cross-sectional view of the glass-clad PbTe-based cable 60 of FIG. 3 taken along line 3A-3A. Cable 60 includes a plurality of monofibers 64, has a width of approximately 5.2 mm, and was produced using a single drawing of the PbTe fibers at a temperature of approximately 300K.

Figure 5:
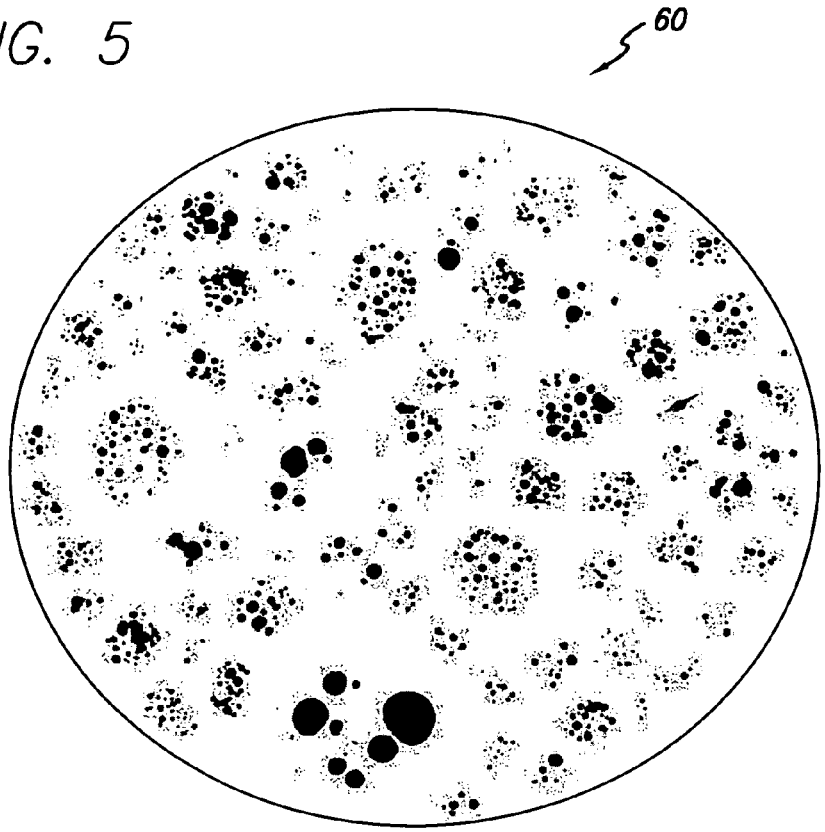
FIG. 5 is a cross-sectional view of the glass-clad PbTe-based cable of FIG. 3 after a second drawing of the PbTe fibers.
Figure 6:
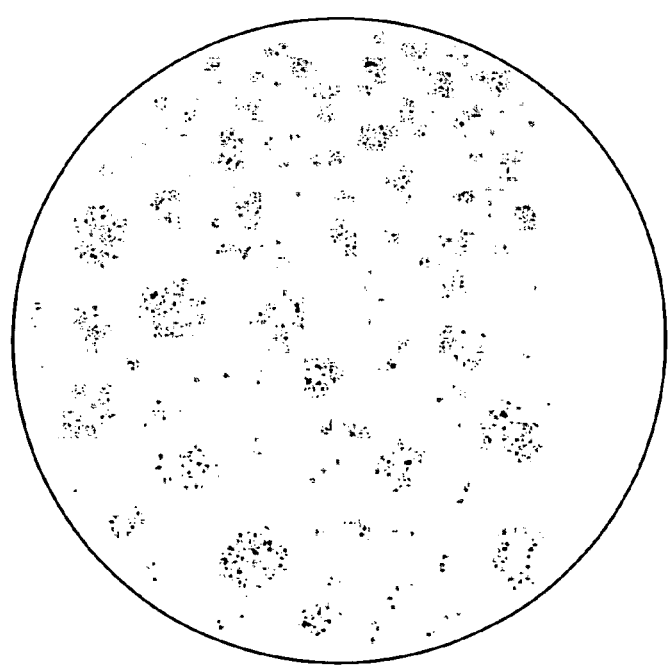
FIG. 6 is a cross-sectional view of the glass-clad PbTe-based cable of FIG. 3 after a third drawing of the PbTe fibers.

According to the preferred embodiment of the invention the cable 60 is bunched together and redrawn several times in succession to produce a multi-core cable having a plurality of individual thermoelectric fibers that are insulated from each other by the glass cladding. FIG. 5 is a cross-sectional view of the glass-clad PbTe-based cable 60 after a second drawing of the PbTe fibers. The twice-drawn cable has a width of approximately 2.78 mm. FIG. 6 is a cross-sectional view of the glass-clad PbTe-based cable 60 after a third drawing of the PbTe fibers, wherein the cable has a width of approximately 2.09 mm.

FIGS. 3-6 illustrate the development of microstructure as the concentration of wires in the cable increases to ~$10^9/cm^2$. These microstructures may be observed using optical and scanning electron microscopes. By way of example, energy dispersive spectroscopy may be employed to unambiguously indicate the presence of PbTe wires in the glass matrix.

Thermoelectric Property Characterization:

Another aspect of the present invention involves the continuity and electrical connectivity of the glass embedded fibers along the entire length of the cable. Electrical connectivity is easily demonstrated by determining the resistance of the cable at different thicknesses. According to a preferred implementation of the invention, the resistance of the glass cladding, without any thermoelectric wires embedded therein, is about 7 to 8 orders of magnitude higher than that of the continuous thermoelectric fibers.

Figure 7:
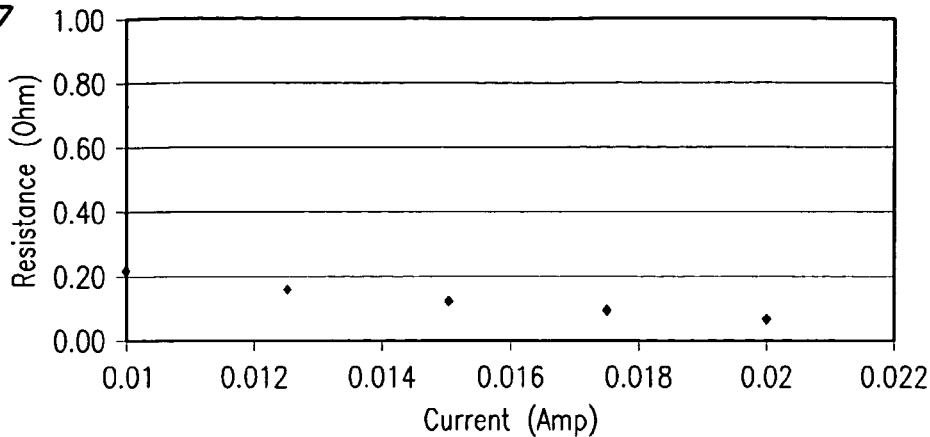
FIG. 7 is a chart illustrating the DC resistance of the PbTe cable of FIG. 4 (after a first drawing of the PbTe fibers)
Figure 8:
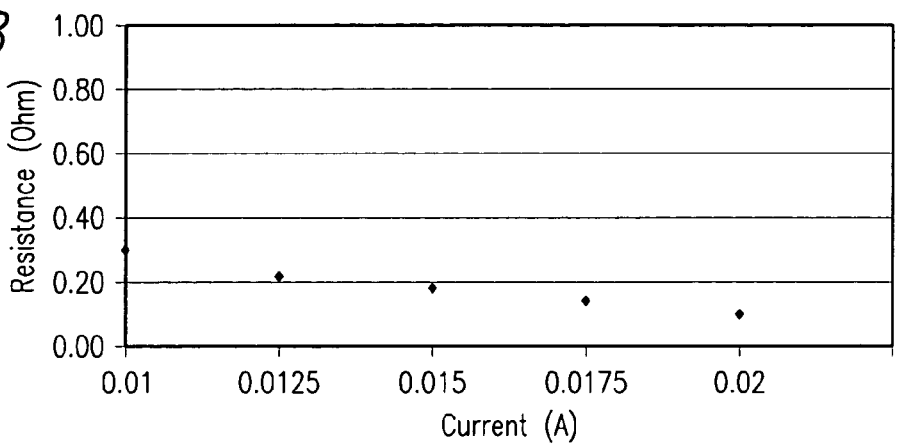
FIG. 8 is a chart illustrating the DC resistance of a PbTe cable of FIG. 5 (after a second drawing of the PbTe fibers)
Figure 9:
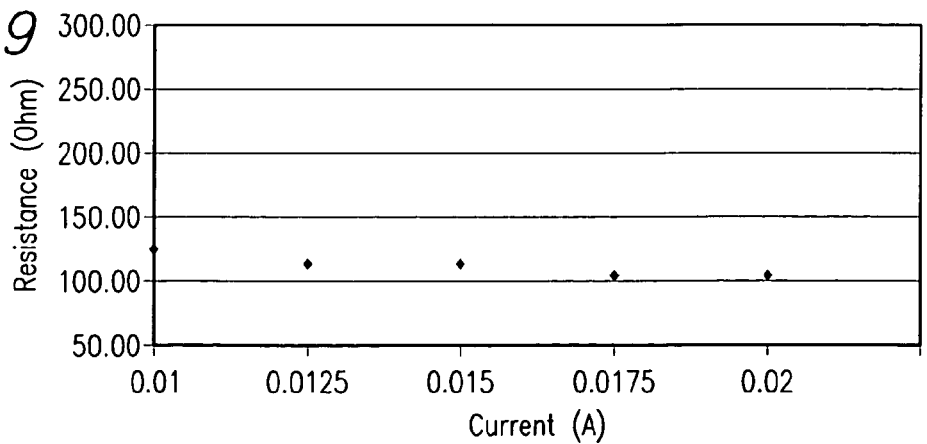
FIG. 9 is a chart illustrating the DC resistance of a PbTe cable of FIG. 6 (after a third drawing of the PbTe fibers).

The samples used to determine electrical connectivity of the thermoelectric wires are in the form of "buttons" of PbTe prepared from the preforms following the one of the fiber drawing steps. Referring to FIGS. 7-9, the resistance of the thermoelectric wires embedded in the glass is approximately 1 ohm or less. On the other hand, the resistance of the glass cladding without thermoelectric wires is more than $10^8$ ohms, which is about 8 orders of magnitude higher than that of the PbTe-embedded cables. This difference in electrical resistance indicates that the glass-clad thermoelectric wires drawn using the methods described herein exhibit electrical connectivity from one end to the other.

FIG. 7 is a chart illustrating the DC resistance of PbTe cable 60 after the first drawing of the PbTe fibers, wherein the resistance of the cable (Ohms) is plotted against the electrical current (amps). In particular, the DC resistance of the cable 60 steadily decreases with an increasing current. FIG. 8 is a chart illustrating the DC resistance of the cable 60 after the second drawing of the PbTe fibers, while FIG. 9 is a chart illustrating the DC resistance of the PbTe cable 60 after the third drawing of the PbTe fibers.

A preferred cable produced in accordance with the principles of the present invention preferably comprises at least one thermoelectric fiber embedded in an electrically insulating material, wherein the thermoelectric material exhibits quantum confinement. According to the preferred embodiment of the invention, a width of each fiber is substantially equivalent to a width of a single crystal of the thermoelectric material, wherein each fiber has substantially the same crystal orientation. The preferred cable comprises a plurality of fibers that are fused or sintered together such that there is electrical connectivity between all the fibers. Alternatively, there is electrical connectivity between some, but not all of, the fibers of the cable.

The glass cladding for the cable preferably comprises an electrically insulating material comprising a binary, ternary or higher component glass structure such as pyrex, borosilicate, aluminosilicate, quartz, and lead telluride-silicate. The thermoelectric material may be chosen from the group consisting of a metal, a semi-metal, an alloy and a semiconductor, such that the thermoelectric material exhibits electrical connectivity and quantum confinement along a predetermined length of cable from several nanometers to miles. The ZT factor of the cable is preferably at least 0.5, more preferably at least 1.5, most preferably at least 2.5.

Thus, it is seen that methods of drawing high density nanowire arrays in a glassy matrix are provided. One skilled in the art will appreciate that the present invention can be practiced by other than the various embodiments and preferred embodiments, which are presented in this description for purposes of illustration and not of limitation, and the present invention is limited only by the claims that follow. It is noted that equivalents for the particular embodiments discussed in this description may practice the invention as well.

What is claimed is:

1. A method of drawing a thermoelectrically active material in a glass cladding, the method comprising the steps of:

sealing off one end of a glass tube such that the tube has an open end and a closed end;

introducing semiconductor thermoelectrically active material particles inside the glass tube;

heating a portion of the glass tube such that the glass partially melts and collapses such that the partially melted glass tube provides an ampoule containing the thermoelectrically active material particles;

introducing the ampoule containing the thermoelectrically active material particles into a heating device;

increasing the temperature within the heating device such that the thermoelectrically active material particles melt and the glass tube is heated enough for it to be drawn;

drawing a glass clad wire comprising a continuous wire of semiconductor thermoelectrically active material;

bunching the glass clad continuous wire of thermoelectrically active material together with other glass clad continuous wires of thermoelectrically active material; and redrawing one or more times in succession to produce a multi core cable having a plurality of individual glass clad continuous wires of thermoelectrically active material that are insulated from each other by the glass cladding;

wherein the semiconductor thermoelectrically active material comprises lead telluride, bismuth telluride, silicon germanium, zinc antimonide, or cadmium antimonide.

2. The method of claim 1, further comprising the steps of:
breaking the glass clad wire into shorter pieces;
introducing the pieces of glass clad wires into another glass tube having a sealed end and an open end;
heating a portion of the glass tube such that the glass partially melts and collapses such that the partially melted glass tube provides an ampoule containing the pieces of glass clad wires;
introducing the ampoule into a heating device;
increasing the temperature within the heating device such that the thermoelectrically active material melts and the glass tube is heated enough for it to be drawn; and
drawing wires of glass clad thermoelectrically active material to produce a cable having a plurality of multi core wires.

3. The method of claim 1, wherein the heating device comprises a vertical tube furnace including a central lumen for receiving the glass tubing.

4. The method of claim 3, wherein the central lumen includes a hot zone for melting the glass tubing.

5. The method of claim 1, wherein the thermoelectrically active material in the cable comprises an array of semiconductor rods embedded in the glass cladding and wherein the semiconductor rods comprise lead telluride, bismuth telluride, silicon germanium, zinc antimonide, or cadmium antimonide.

6. The method of claim 1, wherein the glass cladding is selected to have a wire drawing temperature range that is slightly greater than a melting temperature of the thermoelectric material.

7. The method of claim 1, wherein the glass cladding comprises an electrically insulating material selected from the group consisting of: pyrex; borosilicate; aluminosilicate; quartz; and lead telluride-silicate.

8. The method of claim 1, wherein the cable has a diameter between 70 microns and 200 microns.

9. The method of claim 1, wherein an electrical resistivity of the thermoelectrically active material wire embedded in the glass is less than 1 ohm-cm.

10. The method of claim 1, wherein the glass-clad wires are fused or sintered together such that the wires are electrically connected end to end, but there is no lateral electrical connection between the wires.

11. The method of claim 1, wherein the wires are fused or sintered together such that there is end-to-end electrical connectivity between some, but not all of, the wires.

12. The method of claim 1, wherein a ZT factor of the cable is at least 0.5.

13. The method of claim 1, wherein a ZT factor of the cable is at least 1.5.

14. The method of claim 1, wherein a ZT factor of the cable is at least 2.5.

15. A method of drawing glass clad wires, comprising:
providing a plurality of bunched glass clad continuous semiconductor wires; and
drawing the bunched glass clad-wires one or more times to produce a multi core cable having a plurality of continuous semiconductor wires that are insulated from each other by glass cladding;
wherein the semiconductor wires comprise lead telluride, bismuth telluride, silicon germanium, zinc antimonide, or cadmium antimonide.

16. The method of claim 15, further comprising:
providing a plurality of glass clad continuous semiconductor wires; and
bunching the plurality of glass clad wires together to form the plurality of bunched glass clad continuous semiconductor wires.

17. The method of claim 16, further comprising:
introducing a sealed glass tube containing a semiconductor material into a heating device;
increasing the temperature within the heating device above the semiconductor material melting temperature such that the material melts and the glass tube is heated enough for it to be drawn; and
drawing a glass clad wire comprising one of the plurality of glass clad continuous semiconductor wires.

18. The method of claim 17, further comprising:
sealing off one end of the glass tube such that the tube has an open end and a closed end;
introducing the semiconductor material inside the glass tube;
evacuating the glass tube; and
heating a portion of the glass tube such that the glass partially melts forming the sealed glass tube.

19. The method of claim 18, wherein the step of introducing the semiconductor material comprises introducing a granular semiconductor material inside the glass tube.

20. The method of claim 15, wherein an electrical resistivity of the wires embedded in the glass is less than 1 ohm-cm.

21. The method of claim 15, wherein the plurality of bunched glass clad wires comprise the plurality of glass clad continuous semiconductor wires.

22. The method of claim 21, wherein the plurality of glass clad continuous semiconductor wires comprise a plurality of glass clad continuous thermoelectric semiconductor material wires.

23. The method of claim 22, further comprising forming at least a portion of the cable into a portion of a thermoelectric device.

24. The method of claim 22, wherein:
the thermoelectric semiconductor material consists essentially of PbTe; and
a ZT factor of the cable is at least 1.5.

* * * * *